(12) United States Patent
Davis et al.

(10) Patent No.: US 8,368,248 B2
(45) Date of Patent: Feb. 5, 2013

(54) ACTIVE LOW-PASS CURRENT FILTER

(76) Inventors: Don D. Davis, Katy, TX (US); Adrian P. Glover, Houston, TX (US); Holloway H. Frost, Houston, TX (US)

( * ) Notice: Subject to any disclaimer, the term of this patent is extended or adjusted under 35 U.S.C. 154(b) by 720 days.

(21) Appl. No.: 12/614,908

(22) Filed: Nov. 9, 2009

(65) Prior Publication Data

US 2011/0109159 A1  May 12, 2011

(51) Int. Cl.
*H02J 7/34* (2006.01)
*H02J 1/10* (2006.01)
(52) U.S. Cl. ......................................... 307/52
(58) Field of Classification Search ...................... 307/52
See application file for complete search history.

(56) References Cited

U.S. PATENT DOCUMENTS

| | | | |
|---|---|---|---|
| 5,319,534 A | 6/1994 | Brennen | |
| 5,319,535 A | 6/1994 | Brennen | |
| 7,899,415 B1 * | 3/2011 | Schoneman et al. | 455/114.2 |

OTHER PUBLICATIONS

"High Efficiency Buck-Boost DC/DC uModule," LTM4605 Data Sheet, Linear Technology Corporation, 2007.
"High-Side, Bidirectional Current Shunt Monitor," INA170 Data Sheet, Burr-Brown Products from Texas Instruments, Mar. 2001—revised Nov. 2003.
"High-Side, Bidirectional Current Shunt Monitor," INA170 Data Sheet, Burr-Brown Products from Texas Instruments, Mar. 2001—revised Jan. 2006.
"MIL-STD-461E—Requirements for the Control of Electromagnetic Interference Characteristics of Subsystems and Equipment," Department of Defense Interface Standard, CE101, Aug. 20, 1999, pp. 1-253.
"MIL-STD-461F—Requirements for the Control of Electromagnetic Interference Characteristics of Subsystems and Equipment," Department of Defense Interface Standard, CE101, Dec. 10, 2007, pp. 1-269.
Dongyuan, Z., Jianye, C., Zanji, W. and Yi, W., "An Approximate Inverse System Control Based Active DC Filter Applied in HVDC," 35th Annual IEEE Power Electronics Specialists Conference, Aachen, Germany, 2004, pp. 765-770.
Xiao, G., Pei, Y., Li, K., Yang, X. and Wang, Z., "A Novel Control Approach to the DC Active Power Filter Used in a Low Ripple and Large Stable/Pulse Power Supply," 34th Annual IEEE Power Electronics Specialists Conference, Acapulco, Mexico, Jun. 2003, pp. 1489-1493.
"ST1510FX—High voltage fast-switching NPN Power transistor," STMicroelectronics Data Sheet, Nov. 2005—revised Feb. 2007.
"TLV271, TLV272, TLV274—Family of 550-uA/Ch 3-MHz Rail-to-Rail Output Operational Amplifiers," Texas Instruments Data Sheet, Mar. 2001—revised Feb. 2004.
"2N2222; 2N2222A—NPN switching transistors," Philips Semiconductors Data Sheet, May 29, 1997. "ST1S10-3 A, 900 kHz, monolithic synchronous step-down regulator," STMicroelectronics Data Sheet, Aug. 28, 2007—revised Oct. 25, 2007.
"10A High Efficiency DC/DC uModule," LTM4600 Data Sheet, Linear Technology Corporation, 2006.
"IHLP-2525CZ-01—Low Profile, High Current IHLP Inductors," Vishay Intertechnology Inc. Data Sheet, Vishay Dale, Document No. 34104, revision Jan. 21, 2009.

* cited by examiner

*Primary Examiner* — Rexford Barnie
*Assistant Examiner* — Dru Parries
(74) *Attorney, Agent, or Firm* — Locke Lord LLP

(57) ABSTRACT

An active low-pass current filter apparatus and method reduces conducted emissions above a predefined cutoff frequency at high power levels. The apparatus and method use a bidirectional DC-DC converter to minimize current fluctuations on a power lead that may result in conducted emissions above the predefined cutoff frequency. The bidirectional DC-DC converter absorbs current from the power lead and feeds current to the load lead as needed to compensate for the current fluctuations on the power lead. Power to the DC-DC converter is provided by a separate auxiliary power source. A monitoring circuit compares the voltage level of the auxiliary power source to a reference voltage and compensates for variations in the voltage level of the auxiliary power source without interfering with the suppression of the conducted emissions.

20 Claims, 11 Drawing Sheets

ACTIVE LOW-PASS CURRENT FILTER

CROSS-REFERENCE TO RELATED APPLICATIONS

Not applicable

STATEMENT REGARDING FEDERALLY SPONSORED RESEARCH

Not applicable

REFERENCE TO APPENDIX

Not applicable

COPYRIGHT NOTICE

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

BACKGROUND OF THE INVENTION

1. Technical Field of the Invention

This disclosure relates in general to methods and apparatuses for reducing unwanted electromagnetic emissions.

2. Description of the Related Art

Electromagnetic emissions, in general, may result from any change or variation in current or voltage. Thus, virtually all electronic equipment and components may be a source of electromagnetic emissions. Digital integrated circuits, for example, are one source of electromagnetic emissions due to their frequently changing logic levels. Electromagnetic emissions may also arise from steep increases and decreases in power consumption. These fluctuations in power may occur during certain types of power intensive activity, such as a code upload in a microprocessor. As the code is being loaded, power consumption spikes, then quickly returns to normal after loading is completed. The sharp rise and fall in power consumption can cause electromagnetic emissions to radiate from the microprocessor power lead, leading to a type of emission known as "conducted emissions."

Conducted emissions, like other electromagnetic emissions, can disrupt or interfere with proper operation of nearby electronic equipment or components. This interference can be particularly problematic for mission-critical applications, such as military applications, where proper operation of electronic equipment is highly crucial to the success or failure of an endeavor in many cases. As a result, various technical standards have been established to limit the level of electromagnetic emissions from electronic equipment and components used in military applications. For example, MIL-STD-461 contains a test procedure, CE101, that requires power leads carrying a voltage of 28 V (volts) DC or less to limit conducted emissions between 30 Hz (Hertz) and 10 KHz (Kilohertz) to less than 100 dB μA (decibel micro-amps) for certain military naval applications.

A number of solutions exist for reducing or eliminating electromagnetic emissions. These solutions generally involve using one or more passive or active filters, or both, to reduce the electromagnetic emissions. Passive filters are composed generally of components that are non-directional and do not provide gain, such as resistors (R), inductors (L), and capacitors (C). Active filters, on the other hand, can contain a combination of passive components as well as components that are directional and provide gain, including amplifiers, diodes, transistors, transformers, and the like. An example of an active filter is disclosed in U.S. Pat. No. 5,319,534 directed to a series-parallel active power line conditioner utilizing reduced-turns-ratio transformer for enhanced peak voltage regulation capability. Similarly, U.S. Pat. No. 5,319,535 discloses an active power line conditioner having capability for rejection of common-mode disturbances.

Currently available filters, however, have proved either impractical or ineffective for certain types of high power applications. In power leads carrying 28 V and 25 A (DC), for example, a passive filter capable of reducing conducted emissions over the frequency range specified in MIL-STD-461 (i.e., between 30 Hz and 10 KHz) would require an inductor of such a large size as to be impractical for most high density circuit board applications. And while active filters are available for the specified frequency range (and beyond), no active filters have been found with a sufficiently high rating for the elevated levels of voltage and current mentioned above.

For some applications, an active filter could be constructed using a transistor connected on the main power line between the power source and a load. However, the normal operation of these filters is such that the voltage and/or current delivered to the load would sag, which may adversely affect proper operation of the load. This type of filter has been known to burn off an equivalent amount of energy as the signal to be filtered. Thus, no active or passive filters have been found that are capable of operating effectively, efficiently, and feasibly at high power levels over the frequency range required by MIL-STD-461.

Accordingly, there exists a need for a filter that can overcome the shortcomings of currently available filters as described above. In particular, there is a need for a filter that can reduce conducted emissions on power leads in the 30 Hz to 10 KHz frequency range, and above, at high power levels.

SUMMARY OF THE INVENTION

The disclosed embodiments relate to an active low-pass current filter apparatus and method that is configured to reduce high-frequency conducted emissions or emissions having frequencies above a predefined cutoff frequency, or alternatively within a predefined frequency range, on high-power power leads while ignoring other frequencies. In some embodiments, the apparatus and method use a bidirectional DC-DC converter to minimize current fluctuations on the power lead that may result in conducted emissions. Such a bidirectional DC-DC converter is configured to both absorb current from and feed current to the power lead at frequencies mentioned above. Power for the DC-DC converter is provided from a second, auxiliary power source, such as one or more bulk capacitors or a capacitor bank. This auxiliary power source acts as either a current source or a current sink for the bidirectional DC-DC converter during suppression of the conducted emissions such that the DC-DC converter does not backfeed current to or draw current from the main power source for the frequencies at issue. A monitoring circuit is provided to maintain the auxiliary power source at a substantially constant predetermined voltage level using power from the power lead. The monitoring circuit is configured to compensate for variations in the voltage level of the auxiliary power source that have frequencies below the predefined cutoff frequency, or outside the predefined frequency range, in order to avoid interfering with the suppression thereof.

In general, in one aspect, the disclosed embodiments are directed to an apparatus for reducing conducted emissions on a power line, the power line providing power to load on a load line. The apparatus comprises an active current filter connected to the power line and configured to monitor current in the load line to sense current fluctuations on the load line. It is also possible to configure the active current filter to monitor current in the power line so as to sense current fluctuations on the power line instead. The active current filter generates a corrective signal in response to the sensed current fluctuations and provides the corrective signal to the power line and the load line. This corrective signal causes current to be absorbed from the power line or fed to the load line as needed to reduce current fluctuations in the power line having frequencies above a predefined cutoff frequency. The apparatus further comprises an auxiliary power source within the active current filter that provides a predefined DC voltage to the active current filter, and is configured to operate as a current reservoir for the active current filter to source current to the load line and sink current from the power line. The active current filter is further configured to monitor the predefined DC voltage of the auxiliary power source and to source current to the load line or sink current from the power line as needed to maintain the predefined DC voltage within a predefined voltage range without affecting the reduction of the current fluctuations.

In general, in another aspect, the disclosed embodiments are directed to an apparatus for actively controlling emissions on a power line providing power to a load. The apparatus comprises a main feed line coupled to the power line and a load line, and adapted to source current to the load line or sink current from the power line such that the current on the main feed line provided to the load varies in response to the current sourced to by the power line or and sunk from by the power load line. The apparatus also comprises a first sensor adapted to sense the current provided by the power line to the load, including any high-frequency ripples appearing on the power line. Also present are a second sensor adapted to sense current sourced to or sunk from the power line through the main feed line, and a first differential amplifier coupled to the first and second sensors and adapted to provide a first differential signal representative of a difference between the currents sensed by the first and second sensors. The apparatus further comprises a high-pass filter coupled to receive the first differential signal from the first differential amplifier, and adapted to provide a high-pass signal representative of components of the first differential signal having frequencies above a predefined main cutoff frequency. A second differential amplifier of the apparatus is coupled to receive the high-pass signal from the high-pass filter, and adapted to provide a second differential signal representative of at least the high-pass signal. A bidirectional DC-DC converter of the apparatus is coupled to receive the second differential signal from the second differential amplifier, the bidirectional DC-DC converter being operable in a first mode to source current to the load line and a second mode to sink current from the power line, the bidirectional DC-DC converter being responsive to the second differential signal to source current to the load line or sink current from the power line to reduce high-frequency current ripples appearing on the power line. A power reservoir of the apparatus is coupled to the bidirectional DC-DC converter and adapted to provide power for the bidirectional DC-DC converter to source current to the load line when the bidirectional DC-DC converter is operated in the first mode and to sink current from the power line when the bidirectional DC-DC converter is operated in the second mode. A comparator of the apparatus is coupled to receive a voltage level from the power reservoir and configured to provide a comparator signal representative of a difference between the voltage level of the power reservoir and a reference voltage level. A low-pass filter of the apparatus is coupled to receive the comparator signal from the comparator, the low-pass filter adapted to provide a low-pass signal representative of components of the comparator signal having frequencies below a predefined auxiliary cutoff frequency. The second differential amplifier is additionally coupled to receive the low-pass signal from the low-pass filter, and the second differential signal provided by the second differential amplifier is additionally representative of the low-pass signal. Finally, the bidirectional DC-DC converter is further responsive to the second differential signal to: (i) sink current from the power line to increase the voltage level of the power reservoir when the voltage level of the power reservoir falls below the reference voltage level, and (ii) source current to the load line to decrease the voltage level of the power reservoir when the voltage level of the power reservoir rises above the reference voltage level.

In general, in yet another aspect, the disclosed embodiments are directed to a method of reducing conducted emissions on a power lead using a bidirectional DC-DC converter. The method comprises receiving a differential signal representing a difference between a load current in the a load lead and a feedback current in a main feed line connected to the power lead and the load lead, the differential signal containing substantially only frequencies above a predefined cutoff frequency. The method also comprises receiving an auxiliary feed signal representing an auxiliary voltage signal from an auxiliary power source, the auxiliary feed signal containing substantially only frequencies below the predefined cutoff frequency. The method further comprises generating a corrective signal based on the differential signal and the auxiliary feed signal, the corrective signal causing the bidirectional DC-DC converter to: (i) source current to the load lead or sink current from the power lead as needed to reduce conducted emissions having frequencies above the predefined cutoff frequency; and (ii) source current to load lead or sink current from the power lead as needed to maintain a voltage level of the auxiliary power source within a predefined voltage range.

BRIEF DESCRIPTION OF THE DRAWINGS

The foregoing and other advantages of the invention will become apparent from the following detailed description and upon reference to the drawings, wherein.

DETAILED DESCRIPTION OF EXEMPLARY EMBODIMENTS

Figure 1A:
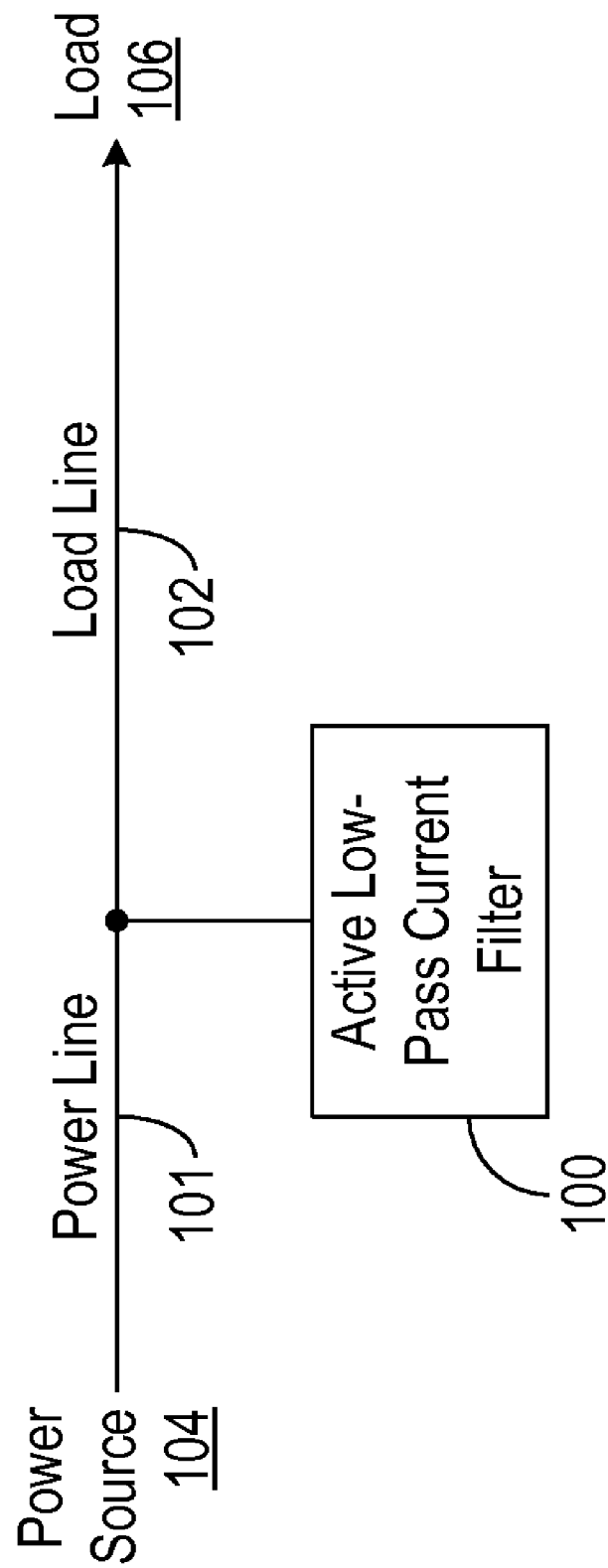
FIGS. 1A-1B illustrate a functional block diagram of an exemplary active low-pass current filter according to the disclosed embodiments.

The drawings described above and the written description of specific structures and functions below are not presented to limit the scope of what has been invented or the scope of the appended claims. Nor are the drawings drawn to any particular scale or fabrication standards, or intended to serve as blueprints, manufacturing parts list, and the like. Rather, the drawings and written description are provided to teach any person skilled in the art to make and use the inventions for which patent protection is sought. Those skilled in the art will appreciate that not all features of a commercial embodiment of the inventions are described or shown for the sake of clarity and understanding.

Persons of skill in this art will also appreciate that the development of an actual commercial embodiment incorporating aspects of the inventions will require numerous implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would be, nevertheless, a routine undertaking for those of skill in this art having benefit of this disclosure.

It should also be understood that the embodiments disclosed and taught herein are susceptible to numerous and various modifications and alternative forms. Thus, the use of a singular term, such as, but not limited to, "a" and the like, is not intended as limiting of the number of items. Similarly, any relational terms, such as, but not limited to, "top," "bottom," "left," "right," "upper," "lower," "down," "up," "side," and the like, used in the written description are for clarity in specific reference to the drawings and are not intended to limit the scope of the invention or the appended claims.

As mentioned above, the disclosed embodiments relate to an active low-pass current filter configured to reduce high-frequency conducted emissions or emissions having frequencies above a predefined cutoff frequency (e.g., 30 Hz) while ignoring frequencies below the predefined cutoff frequency on a high-power power lead. The active low-pass current filter performs this function by using power from an auxiliary DC power source that is separate from the power lead to suppress the conducted emissions. In accordance with the disclosed embodiments, because the active low-pass current filter only needs to supply a current equal in amplitude as the emissions which are to be suppressed, it can be made much smaller and simpler than existing filters that must pass the entire current of the power line to be filtered. Furthermore, as the voltage on the auxiliary DC power source waivers due to the power being used to suppress emissions, the active low-pass current filter is configured to draw current from or feed current to the power lead to restore or maintain the auxiliary power source substantially at a predetermined DC voltage level, or at least within a predefined range (e.g., 10%) of the predetermined DC voltage level.

In some embodiments, the active low-pass current filter maintains the auxiliary power source substantially at a predetermined DC voltage level (or within a predefined range thereof) by taking advantage of the fact that only conducted emissions having frequencies above the predefined cutoff frequency need to be suppressed on the power lead. This means that current may be drawn from or fed to the power lead by other components so long as the current drawn from or fed to the power lead does not give rise to current fluctuations or ripples that are above the predefined cutoff frequency. As the rise and fall in voltage on the auxiliary DC power source are expected to have, or may be filtered to have, only frequencies that are below the predefined cutoff frequency, the active low-pass current filter is thus able to use power from the power lead to compensate for these voltage swings. This ability of the active low-pass current filter to maintain the auxiliary DC power source substantially at full or designated capacity using power from the power lead allows the filter to suppress conducted emissions with even relatively high voltages (e.g., 28 V or more) and currents (e.g., 25 A or more).

In some embodiments, the predefined cutoff frequency may be the minimum frequency specified by MIL-STD-461, or about 30 Hz, but the principles and teachings disclosed herein may also be applied to other frequencies and frequency ranges without departing from the scope of the disclosed embodiments. Similarly, in some embodiments, it may be desirable to step down the high voltage specified by MIL-STD-461 to an intermediate voltage (e.g., from 28 V to 12 V) using a step-down voltage regulator, depending on system and/or component requirements. Furthermore, in some embodiments, the specified maximum allowed conducted emission of 100 dB µA may be increased or decreased as needed without departing from the scope of the disclosed embodiments. Thus, it should be clear to those having ordinary skill in the art that any specific frequency, frequency ranges, voltages, currents, and/or emission levels referenced herein are mentioned solely for illustrative purposes.

Figure 1B:
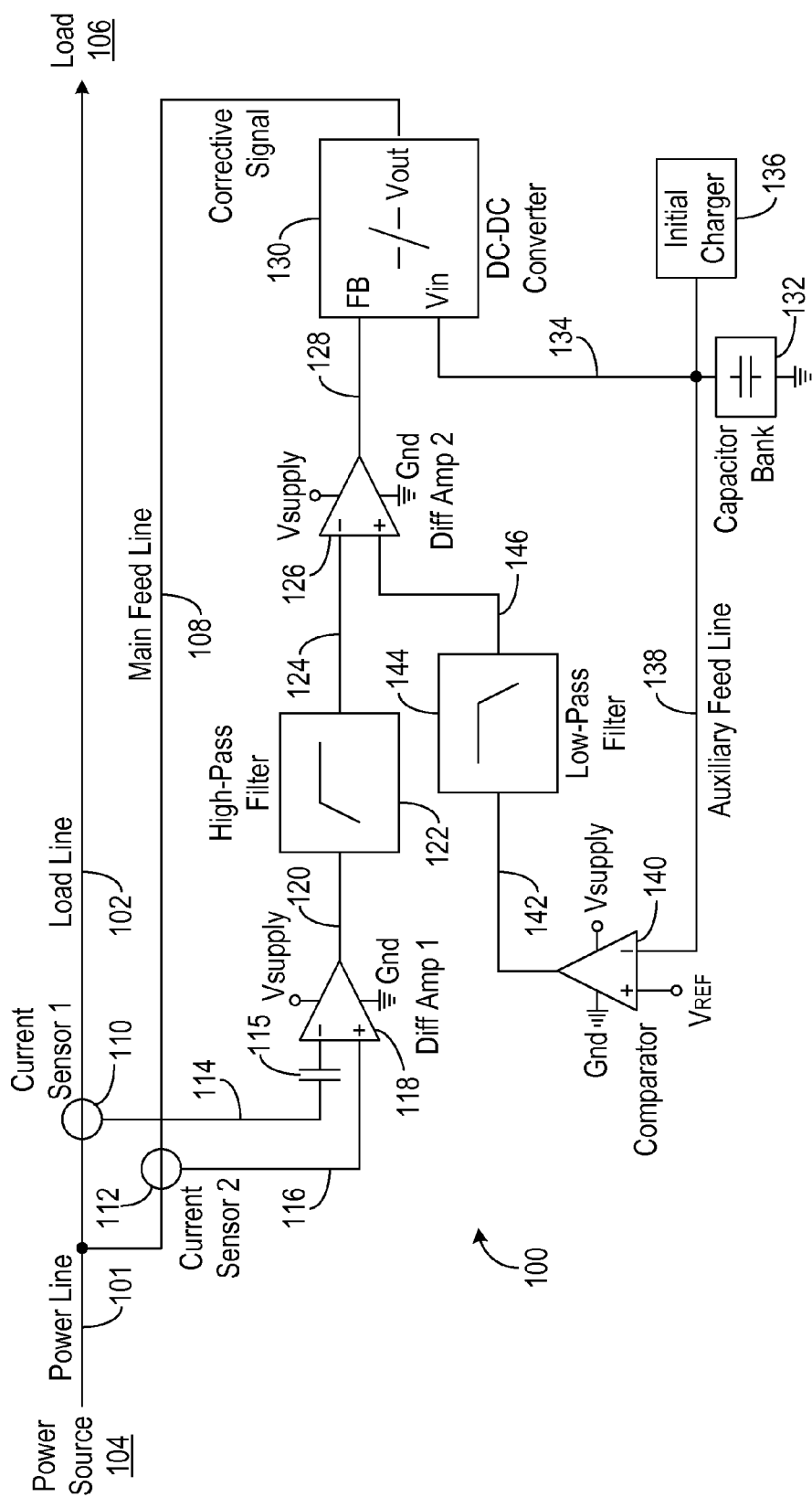

Turning now to FIGS. 1A-1B, a functional block diagram of an exemplary active low-pass current filter 100 according to the disclosed embodiments is shown. Referring to FIG. 1A, the active low-pass current filter 100 is connected to a power line 101 extending between a main power source 104 and a load 106. The power line 101 in the embodiment shown here may be may be any line or portion thereof, sometimes also referred to as a "power lead," that carries current and voltage from the main power source 104 to the load 106. The main power source 104 may be any suitable power source, including a main power supply, an intermediate power converter, a point-of-load regulator, and the like. In some embodiments, the main power source is a 12 V and 25 A (DC) power source. Similarly, the load 106 may be any suitable load, including a piece of equipment, a printed circuit board, a particular area on the print circuit board, or an individual component (e.g., microprocessor), and the like.

FIG. 1B shows the active low-pass current filter 100 in more detail. As can be seen, a main feed line 108 provides the primary connection between the power line 101, the load line 102 and the filter 100. In the embodiment shown, the filter 100 is connected in parallel with the load 106 via first and second shunt type current sensors 110 and 112. The output from the current sensors 110 and 112 are connected via lines 114 and 116, respectively, to the negative and positive input terminals, respectively, of a first differential amplifier 118. A capacitor 115 may be inserted on line 114 between the first current sensor 110 and the first differential amplifier 118 in some embodiments to remove any DC offset that may be present online 114.

The output from the first differential amplifier 118 is then connected via line 120 to a high-pass filter 122, the output from which is in turn connected via line 124 to the negative input terminal of a second operational amplifier 126. The output of the second operational amplifier 126 is then connected via line 128 to the feedback input of a bidirectional DC-DC converter 130. The bidirectional DC-DC converter 130 may be, for example, a high-speed combination buck-boost converter, or separate buck and boost converters that are combined together as a single converter. These bidirectional converters typically have an operational mode in which they source current and a second operational mode in which they sink current (hence the use of the term "bidirectional"). Other converters that operate in a similar manner or perform similar functions may also be used for the bidirectional DC-DC converter 130 without departing from the disclosed embodiments. The output of the bidirectional DC-DC converter 130 is then connected back to the power line 101 via the main feed line 108 and the second current sensor 112.

An auxiliary DC power source 132, which is a separate power source from the main power source 104, provides power via line 134 to the bidirectional DC-DC converter 130. Such an auxiliary DC power source 132 serves essentially as a reservoir of power for the bidirectional DC-DC converter 130, absorbing current from the power line 101 and providing power to the load line 102, as needed, through the bidirectional DC-DC converter 130. The auxiliary DC power source 132 may be one or more bulk capacitors, a bank of capacitors, or other intermediate storage elements that are able to hold a sizable amount of charge, such as one or more so-called "super capacitors." In the specific example of FIG. 1B, the auxiliary power source 132 is a bank of capacitors. An initial charger circuit 136 is connected to the bank of capacitors 132 to provide an initial charge (e.g., 6 V) thereto when the filter 100 is first powered on.

The bank of capacitors 132 is in turn connected via an auxiliary feed line 138 to a comparator 140, specifically the negative input terminal thereof. The comparator 140, which may be an operational amplifier connected in an inverting configuration in some embodiments, has its positive input terminal connected to a predetermined DC reference voltage VREF (e.g., about 6 V). The output of the comparator 140 is connected via line 142 to a low-pass filter 144, which is in turn connected via line 146 to the positive input terminal of the second differential amplifier 126. In some environments, these various components 110-146 of the filter 100, as well as other electrical components discussed throughout this disclosure, may be standard, commercially available electrical components that are well known to those having ordinary skill in the art.

In a main operation, suppression of conducted emissions having frequencies above the predefined cutoff frequency begins with the first current sensor 110 detecting the current in the load line 102, including any high-frequency current fluctuations or ripples therein, while the second current sensor 112 detects the current in the main feed line 108. The sensed signals from the current sensors 110 and 112 are then provided via lines 114 and 116, respectively, to the first differential amplifier 118, which produces a differential signal on line 120 that substantially reflects the difference between the two sensed signals.

The differential signal on line 120 is thereafter filtered by the high-pass filter 122 to attenuate any frequencies therein that are below the predefined cutoff frequency such that only frequencies above the predefined cutoff frequency are passed.

In accordance with the disclosed embodiments, the high-pass filter 122 may be selected, or configured, so that it has a 3 dB frequency that coincides with the predefined cutoff frequency (e.g., 30 Hz), and preferably well below the predefined cutoff frequency. This helps ensure that only frequencies in the differential signal above the predefined cutoff frequency are allowed through, via line 124, to the second differential amplifier 126 while frequencies below the predefined cutoff frequency are attenuated. In some embodiments, the predefined cutoff frequency may be a frequency that results in 20 to 30 dB of gain for the high-pass filter 122 at the predefined cutoff frequency. Alternatively, instead of a high-pass filter, it is also possible to filter the differential signal on line 120 using a bandpass filter so that only frequencies within a predefined range (e.g., 30 Hz to 100 kHz) are allowed through.

The high-pass filtered differential signal is subsequently provided on line 124 to the second differential amplifier 126, which also receives an auxiliary feed signal on line 146 that has been filtered to attenuate frequencies above the predefined cutoff frequency (as will be described below). The second differential amplifier 126 then uses the received high-pass filtered differential signal and the low-pass filtered auxiliary feed signal to produce an error signal on line 128.

The low-pass filtered auxiliary feed signal online 146 is essentially an inverted representation of the variations in the voltage level of the capacitor bank 132. In an auxiliary operation, the operation of the bidirectional DC-DC converter 130 (i.e., sourcing and sinking current) causes variations in the predefined DC voltage level of the capacitor bank 132 supplying power to the DC-DC converter 130. These voltage variations are provided via the auxiliary feed line 138 to the comparator 140, which compares the variations to a reference voltage VREF (e.g., 6 V) to produce an auxiliary feed signal on line 142. The auxiliary feed signal on line 142 may then be filtered by the low-pass filter 144 in order to attenuate any variations on the capacitor bank 132 that are above the predefined cutoff frequency. In this regard, the capacitor bank 132 is expected to have a sufficiently large capacitance such that any variations having frequencies above the predefined cutoff frequency will be small (e.g., within 5 percent of the predefined DC voltage).

In accordance with the disclosed embodiments, the low-pass filter 144 may be selected, or configured, so that it has a 3 dB frequency that coincides with, and is preferably well below (e.g., a 3 dB frequency at 20 Hz), the predefined cutoff frequency. This helps ensure that only frequencies in the auxiliary feed signal that are below (and preferably well below) the predefined cutoff frequency are allowed through, via line 146, to the second differential amplifier 126 while frequencies above the predefined cutoff frequency are attenuated. In some embodiments, the predefined cutoff frequency associated with the low-pass filter 144 may be the same as the predefined cutoff frequency associated with the high-pass filter 122, but it may also be useful in some applications to have two cutoff frequencies that are entirely different frequencies. The resulting low-pass filtered auxiliary feed signal on line 146 is essentially an inverted representation of the variations in the voltage level of the capacitor bank 132.

At the second differential amplifier 126, the high-pass filtered differential signal from line 124 and the low-pass filtered auxiliary feed signal from line 146 are combined to produce an error signal on line 128. This error signal, which is essentially a composite of two signals: (i) the high-pass filtered differential signal representing current fluctuations above the predefined cutoff frequency, and (ii) the low-pass filtered auxiliary feed signal representing voltage variations below the predefined cutoff frequency, is thereafter used by the bidirectional DC-DC converter 130 to generate a corrective signal on the main feed line 108.

In accordance with the disclosed embodiments, the corrective signal generated by the bidirectional DC-DC converter 130 on the main feed line 108 is also a composite of two signals: (i) a signal having frequencies above the predefined cutoff frequency that is approximately equal in magnitude to the current fluctuations on the load line 102, and (ii) a signal having frequencies below the predefined cutoff frequency that compensates for voltage variations on the capacitor bank 132. And because the two signals have non-overlapping frequencies, they do not interfere with each other with respect to suppression of conducted emissions or compensation of voltage variations.

The corrective signal is thereafter provided via the main feed line 108 to the power line 101 and the load line 102 to suppress conducted emissions above the predefined cutoff frequency on the power line 101. Thus, for example, for a given current spike having a frequency above the predefined cutoff frequency that appears on the load line 102, the bidirectional DC-DC converter 130 generates a current spike similar in magnitude on the main feed line 108 to counter or cancel out the spike on the power line 101. Moreover, the bidirectional DC-DC converter 130 preferably has a sufficiently fast response time such that it generates the current spike on the main feed line 108 substantially in time with the current spike on the load line 102. In general, the response time needed for the bidirectional DC-DC converter 130 will depend on the various requirements of a particular application, including the specific frequencies of the emissions that need to be filtered.

The corrective signal also compensates for any variations in the voltage level of the capacitor bank 132 below the predefined cutoff frequency. Thus, for example, for a given voltage drop in the capacitor bank 132 having a frequency below the predefined cutoff frequency, the bidirectional DC-DC converter 130 pulls current from the power line 101 and into the capacitor bank 132 to thereby replenish the charge therein.

Figure 2:
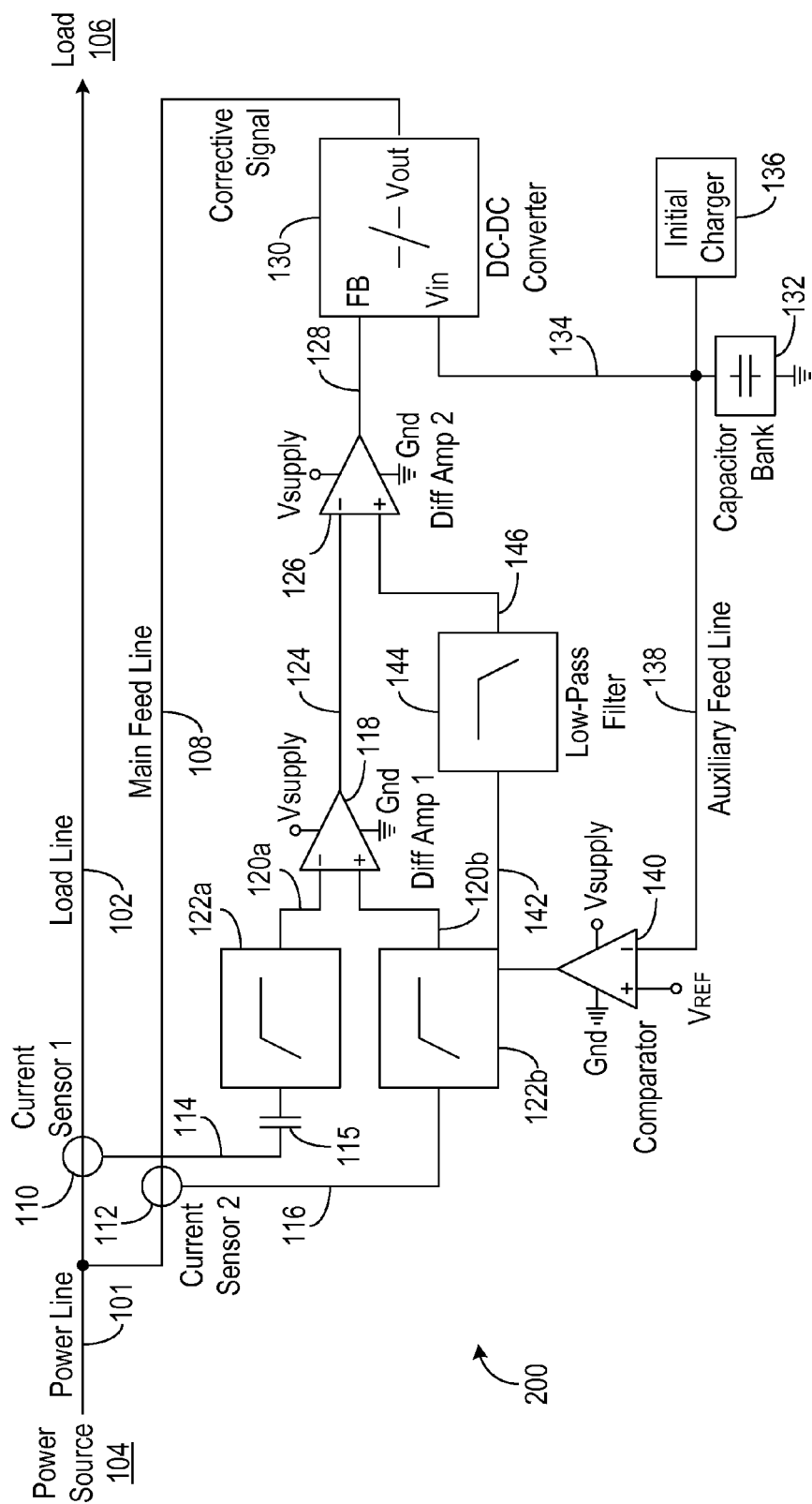
FIG. 2 illustrates a functional block diagram of another exemplary active low-pass current filter according to the disclosed embodiments.

FIG. 2 illustrates another active low-pass current filter 200 for suppressing conducted emissions according to the disclosed embodiments. The active low-pass current filter 200 is similar to the filter 100 of FIG. 1B in most respects except that the single high-pass filter 122 disposed after the first differential amplifier 118 has been replaced with two high-pass filters 122a and 122b, one for each current sensor 110 and 112, disposed in front of the first differential amplifier 118. Under this arrangement, the sensed signals from the current sensors 110 and 112 are provided via lines 114 and 116, respectively, to the inputs of the high-pass filters 122a and 122b, respectively instead of the first differential amplifier 118. Lines 120a and 120b then connect the output of the high-pass filters 122a and 122b to the inputs of the first differential amplifier 118.

Operation of the filter 200 in FIG. 2 is otherwise identical to operation of the filter 100 in FIG. 1B, except that the high-pass filters 122a and 122b filter the sensed signals for frequencies above the predefined cutoff frequency (e.g., 30 Hz) prior to generation of the differential signal on line 124 by the first differential amplifier 118 instead of afterwards, as was the case in the filter 100 of FIG. 1B.

Figure 3:
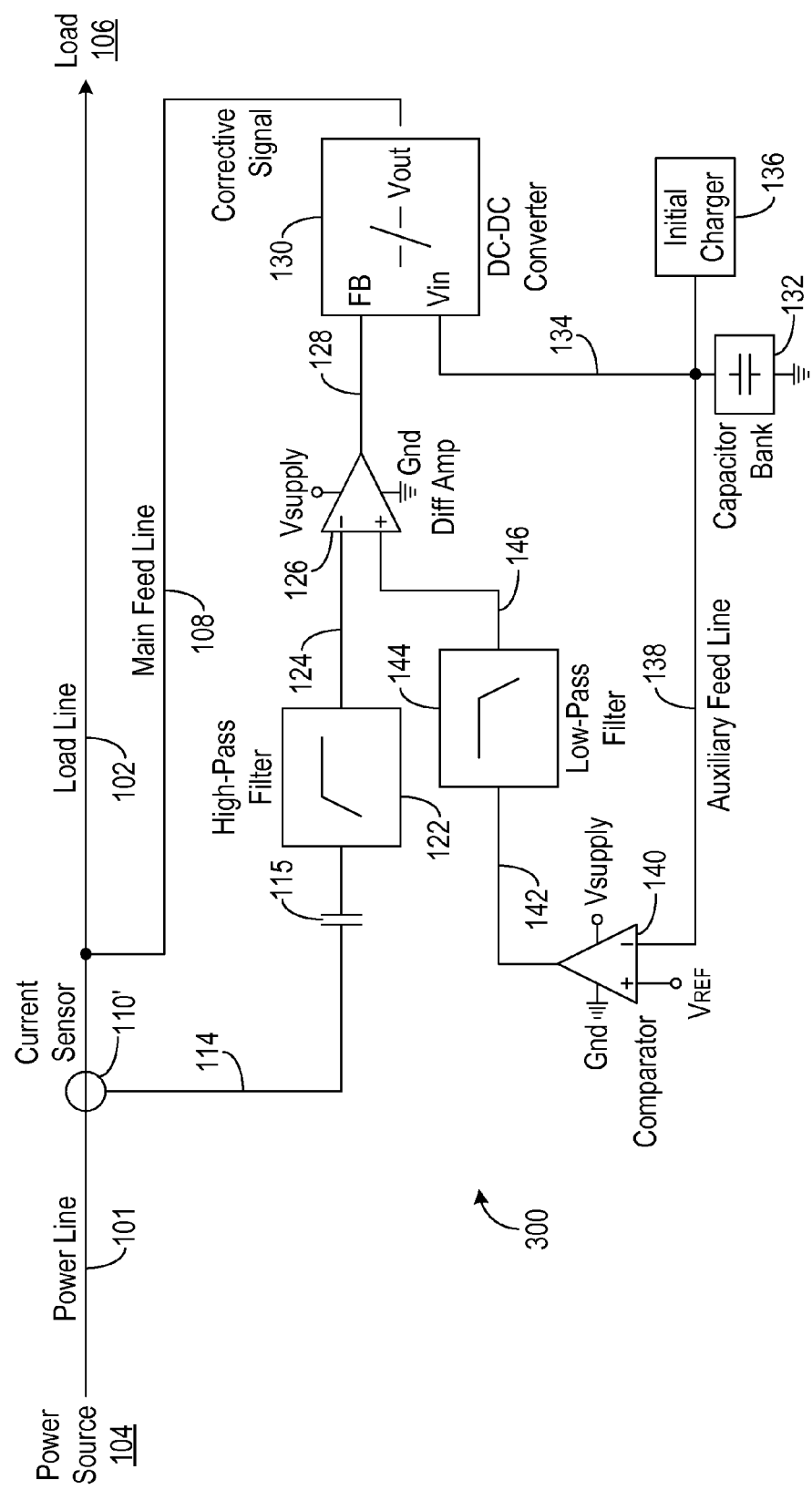
FIG. 3 illustrates a functional block diagram of yet another exemplary active low-pass current filter according to the disclosed embodiments.

FIG. 3 illustrates yet another exemplary active low-pass current filter according to the disclosed embodiments. The active low-pass current filter 300 is also similar to the filter 100 of FIG. 1B, except that it uses only one current sensor and one differential amplifier. As can be seen, the second current sensor 112 on the main feed line 108 and the first differential amplifier 118 have been removed, and the first current sensor 110 on the load line 102 has instead been replaced with a current sensor 110' on the power line 101. This arrangement results in the sensed signal from the current sensor 110' being provided directly to the high-pass filter 122 (via the offset capacitor 115).

In general operation, any current fluctuations in the power line 101 within the frequency range (i.e., above the predefined cutoff frequency) of the high-pass filter 122 are combined with the low-pass filtered auxiliary feed signal on line 146 at the second differential amplifier 126. The second differential amplifier 126 resolves the high-pass filtered current signal on line 124 and the capacitor bank voltage level low-pass filtered signal on line 146 into an error signal on line 128. This error signal is then provided to the DC-DC converter 130 to generate a corrective signal in the main feed line 108 such that load fluctuations in the frequency range of the high-pass filter 122 will be present only on the main feed line 108 and the load line 102 and not on the power line 101. The charge on the capacitor bank 132 is again maintained by sourcing current to the load line 102 or sinking current from the power line 101 in the frequency range (i.e., below the predefined cutoff frequency) of the low-pass filter 144 in the manner described above with respect to FIG. 1B.

FIGS. 4-7 are circuit diagrams of an exemplary implementation of the active low-pass current filter 200 of FIG. 2. These circuit diagrams are provided solely for illustrative purposes and do not represent restrictions or limitations on the disclosed embodiments. Those having ordinary skill in the art will understand that numerous variations and alternatives may be derived depending on the specific requirements of a particular application. For economy of the description, it should be noted at the outset that power to the various components in the circuit diagrams are provided by power rails of an appropriate voltage for each component, labeled "S+" for positive voltage and "S−" for negative voltage. Furthermore, all resistors, capacitors, and inductors may be replaced by their circuit equivalents as needed without departing from the scope of the disclosed embodiments.

Figure 4:
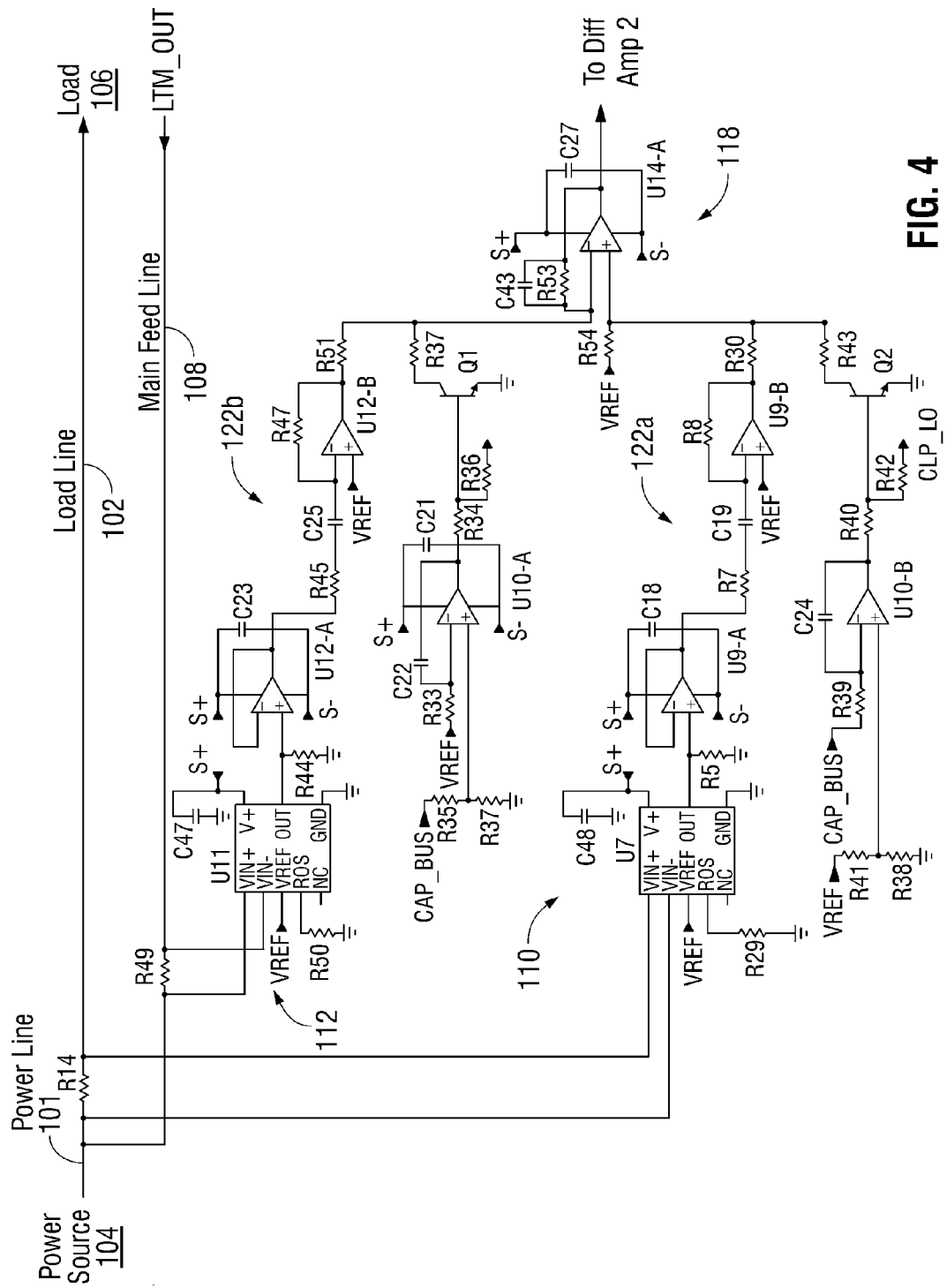
FIG. 4 illustrates a circuit diagram of an exemplary current sensor, high-pass filter, and differential amplifier that may be used for the active low-pass current filter according to the disclosed embodiments.

Referring first to FIG. 4, an exemplary implementation of the first and second current sensors 110 and 112, first and second high-pass filters 122a and 122b, and first differential amplifier 118 is shown. Note that throughout the various figures, the corrective signal on the main feed line 108 has been labeled as "LTM_OUT" and the error signal has been labeled as "LTM_FB." In this embodiment, the current sensors 110 and 112 are implemented using high-side bidirectional current shut monitors from Texas Instruments, part number INA170, labeled here as U7 and U11, respectively. Input to the shunt monitors are provided via resistors R14 and R49, respectively, inserted in the load line 102 and main feed line 108, respectively. Power to the shunt monitors 110 and 112 may be coupled to ground using capacitors C48 and C47, respectively. A reference voltage VREF of about 6 V (DC) is provided along with offset resistors R29 and R50, respectively.

The outputs of the shunt monitors U7 and U11 are then provided to the high-pass filters 122a and 122b, which are implemented here using standard commercially available operational amplifiers. The operational amplifiers shown here and throughout the various figures herein are from Texas Instruments, part number TLV272CDGK, each having two operational amplifiers (referenced as "A" and "B").

The output of the first shunt monitor U7 is provided to the first high-pass filter 122a via the positive input of one of its operational amplifiers, U9-A. Pulldown resistor R5 may also be connected to the positive input of operational amplifier U9-A, which has coupling capacitor C18 between its power supplies. The negative input of U9-A is tied to its output, which is in turn connected to the negative input of another operational amplifier, U9-B, through resistor R7 and capacitor C19. The output of operational amplifier U9-B is connected to its negative input terminal via resistor R8, and VREF is connected to its positive terminal.

The output of operational amplifier U9-B is further connected to the collector of transistor Q2, which may be an NPN transistor, part number 2222 (available from multiple vendors), through resistor R43. The base of transistor Q2 is driven by yet another operational amplifier, U10-B, through resistor R40 connected to the output of the operational amplifier U10-B. The output of this operational amplifier is coupled via capacitor C24 to its negative input terminal, which is in turn connected to the output of the capacitor bank 132, labeled here as "CAP_BUS" (see FIG. 7), through resistor R39. The positive input terminal of operational amplifier U10-B is connected to VREF via a divider network made of resistor R41 and resistor R38.

The output of the second shunt monitor U11 is provided to the second high-pass filter 122b via the positive input of one of its operational amplifiers, U12-A. Pulldown resistor R44 may also be connected to the positive input of operational amplifier U12-A, which has coupling capacitor C23 between its power supplies. The negative input of U12-A is tied to its output, which is in turn connected to the negative input of another operational amplifier, U12-B, through resistor R45 and capacitor C25. The output of operational amplifier U12-B is connected to its negative input terminal via resistor R47, and VREF is connected to its positive terminal.

The output of operational amplifier U12-B is further connected to the collector of transistor Q1, which may be an NPN transistor, part number 2N2222 (available from multiple vendors), through resistor R37. The base of transistor Q1 is driven by yet another operational amplifier, U10-A, through resistor R34 connected to the output of operational amplifier U10-A. The output of this operational amplifier is coupled via capacitor C22 to its negative input terminal, which is in turn connected to one VREF through resistor R33. The positive input terminal of operational amplifier U10-A is connected to the output of capacitor bank 132 via a divider network made of resistor R35 and resistor R32. Operational amplifier U10-A also has coupling capacitor C21 between its power supplies.

The outputs of the first and second high-pass filters 122A and 122B are connected to the first differential amplifier 118 via resistors R30 and R51, respectively, to the positive and negative inputs, respectively, of its operational amplifier U14-A. This operational amplifier U14-A also has its positive input connected to VREF through resistor R54. The output of operational amplifier U14-A is connected to its negative input through a parallel combination of resistor R53 and capacitor C43, and also fed to the second differential amplifier 126.

Signals CLP_HI and CLP_LO, which are connected via resistors R36 and R42 to the bases of the transistors Q1 and Q2, respectively, are used to disable the filter while during startup so the initial charger circuit 136 (see FIG. 7) may charge the capacitor bank 132 and disable the filter on shutdown to keep the filter from trying to power the system completely from the capacitor bank.

Figure 5:
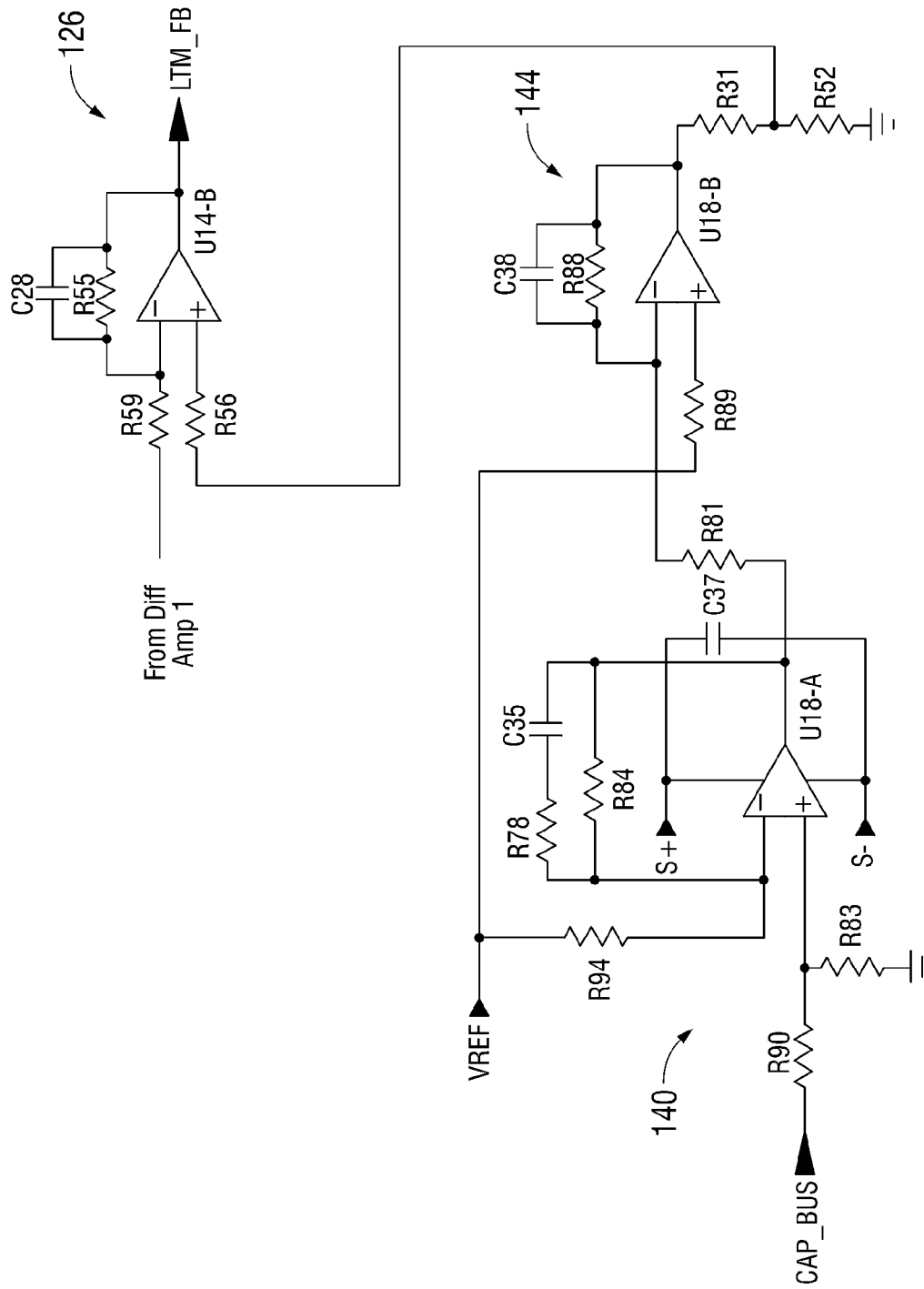
FIG. 5 illustrates a circuit diagram of an exemplary low-pass filter and differential amplifier that may be used for the active low-pass current filter according to the disclosed embodiments.

Referring to FIG. 5, an exemplary implementation of the second differential amplifier 126, comparator 140, and low-pass filter 144 is shown. With respect to the second differential amplifier 126, shown here as part U14-B, this amplifier has its negative input connected to the output of the first differential amplifier 118, which is operational amplifier U14-A, through resistor R59. The negative input of operational amplifier U14-B is also connected to its output via a network composed of resistor R55 and capacitor C28 connected in parallel. The output of operational amplifier U14-B, labeled here as LTM_FB, is then provided to the bidirectional DC-DC converter 130 (see FIGS. 6A-6B). Meanwhile, the positive input of operational amplifier U14-B is connected to the output of the low-pass filter 144.

The low-pass filter 144 in the example shown here is composed of an operational amplifier U18-B, the positive input of which is connected to reference voltage VREF via resistor R89. The negative input of operational amplifier U18-B is connected to its output through a parallel combination of resistor R88 and capacitor C38. The output of operational amplifier U18-B is also connected to the positive input of operational amplifier U14-B of the second differential amplifier 126, as mentioned above, via resistor R31 or, optionally, a divider network composed of resistor R31 and resistor R52.

The comparator 140 is composed of an operational amplifier U18-A having its positive input connected to the output CAP_BUS of the capacitor bank 132 via resistor R90. A pulldown resistor R83 may also be provided for the positive input, as well as coupling capacitor C37 for the power supplies. The negative input of operational amplifier U18-A is connected to VREF via resistor R94. The negative input is also connected to the output of operational amplifier U18-A through a network composed of resistor R78 connected in series with capacitor C35, these two components in turn being connected in parallel with resistor R84. The output of operational amplifier U18-A is thereafter connected to the negative input of the previous operational amplifier, U18-B, through resistor R81.

Figure 6A:
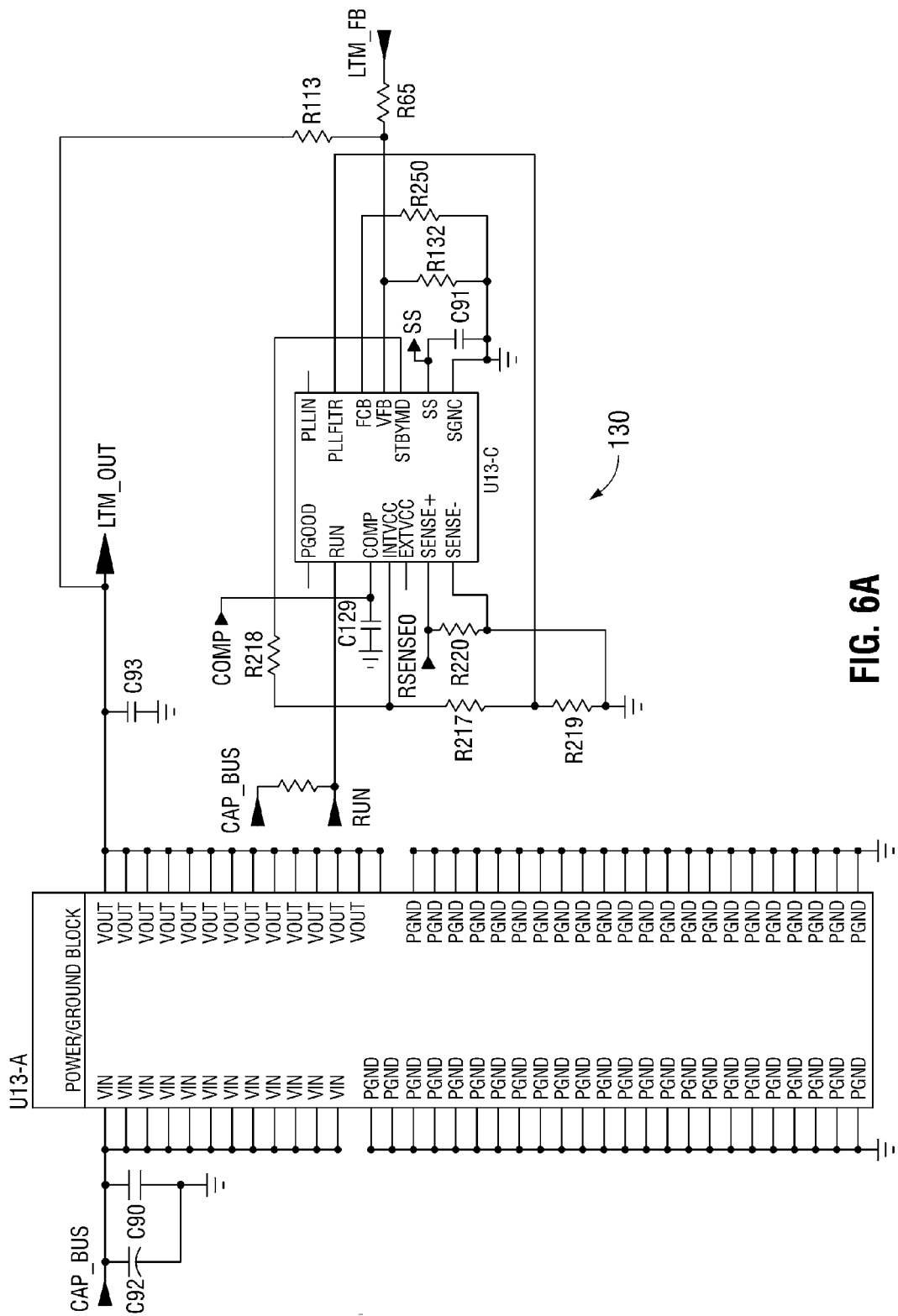
FIGS. 6A-6B illustrate a circuit diagram of an exemplary DC-DC converter that may be used for the active low-pass current filter according to the disclosed embodiments.
Figure 6B:
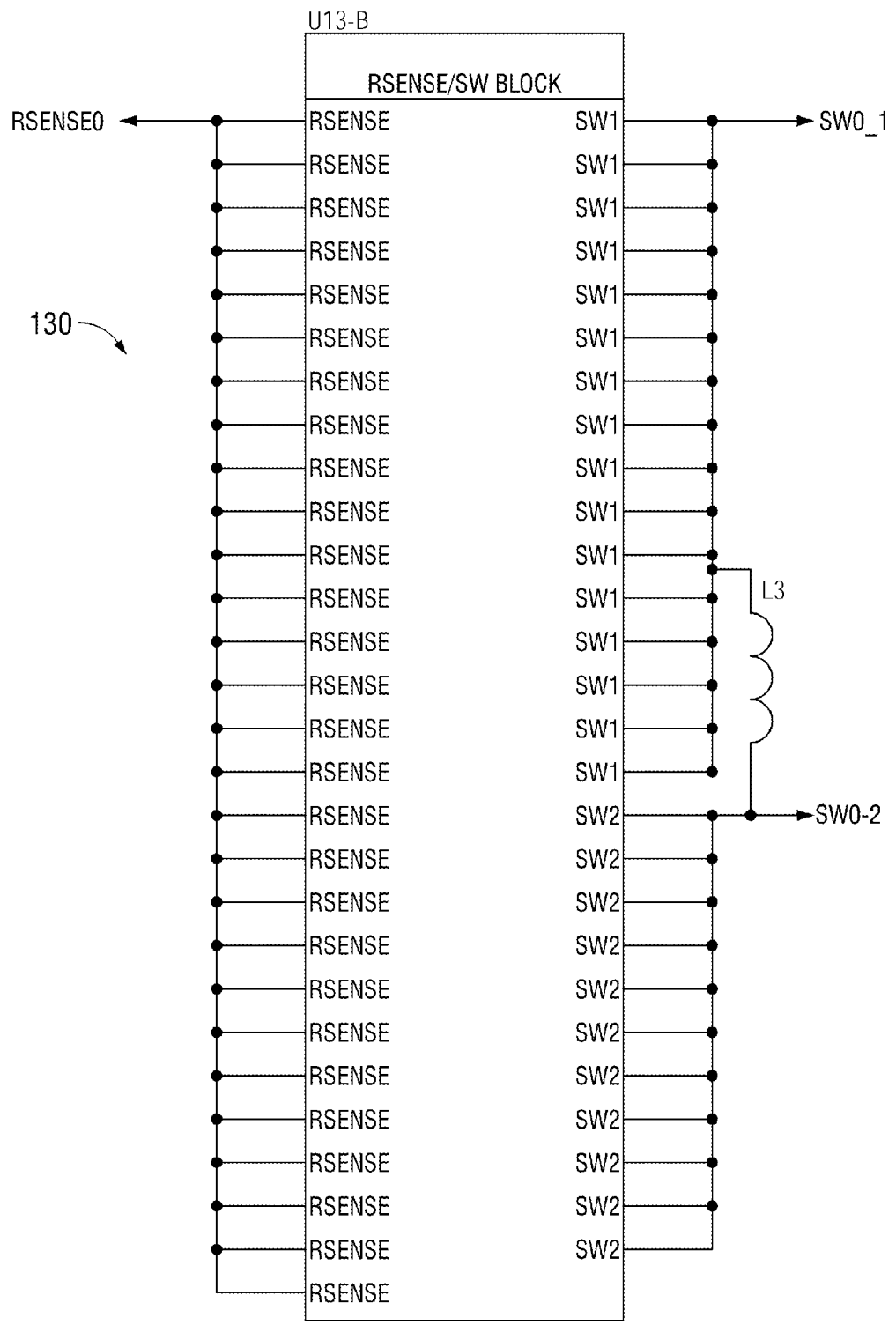

FIGS. 6A and 6B illustrate an exemplary implementation of the bidirectional DC-DC converter 130. As can be seen in FIG. 6A and 6B, in some embodiments, the bidirectional DC-DC converter 130 may include a buck-boost DC-DC power supply from Linear Technology, part number LTM4605, labeled here as U13-A, U13-B, and U13-C. The LTM4605 power supply in these figures is divided into three sections based upon their functions, where U13-A is the Power/Ground Block, U13-B is the RSense/SW Block, and U13-C is the main controller block. Note that the LTM4605 uses an LGA (Land Grid Array) chip package and, as is common practice for these types of packages, the input pins (VIN), output pins (VOUT), resistor current sense (RSENSE), switch 1 (SW1), switch 2 (SW2), and ground pins (PGND) have been tied together.

In accordance with the disclosed embodiments, the inputs to the power supply U13-A is provided by the output CAP_BUS of the capacitor bank 132 (see FIG. 7) via a parallel combination of capacitor C90 and capacitor C92. A capacitor C93, or optionally an appropriate network of such capacitors, may be provided to couple the outputs of the power supply U13-A to ground.

The buck-boost control block U13-C has its feedback reference voltage (VCB) pin connected to the error signal LTM_FB through resistor R65 as well as to the corrective signal LTM_OUT through resistor R113. Resistor R132 is connected between the feedback reference voltage (VFB) pin and ground. Similarly, resistor R250 is connected between the forced continuous input (FCB) pin of the buck-boost module U13-C and ground. Coupling capacitor C91 couples the soft start charging current pin of the buck-boost module U13-C to ground. The current control threshold and amplifier compensation (COMP) pin of the buck-boost module U13-C may be coupled to ground via capacitor C129. Resistor R218 connects the standby mode (STBYMD) pin to the U13-C internal VCC (INTVCC) pin. Resistors R217 and R219 create a voltage divider from the internal VCC (INTVCC) and feed this voltage into the phase-locked loop filter (PLLFLTR) pin to set the switching frequency for the buck-boost module U 13-C.

The positive sense input (SENSE+) pin of the buck-boost module U13-C, labeled here as RSENSE0, is connected to the RSense/SW Block U13-B, as shown in FIG. 6B. The RSENSE0 line is also connected to ground through resistor R220. The negative sense input (SENSE−) of the buck-boost module U13-C is also connected to ground. Likewise, the signal ground (SGND) pin is also connected to ground. An inductor L3 is connected between the two switch pins of the RSense/SW Block U13-B (SW1 and SW2), as shown in FIG. 6B.

Figure 7:
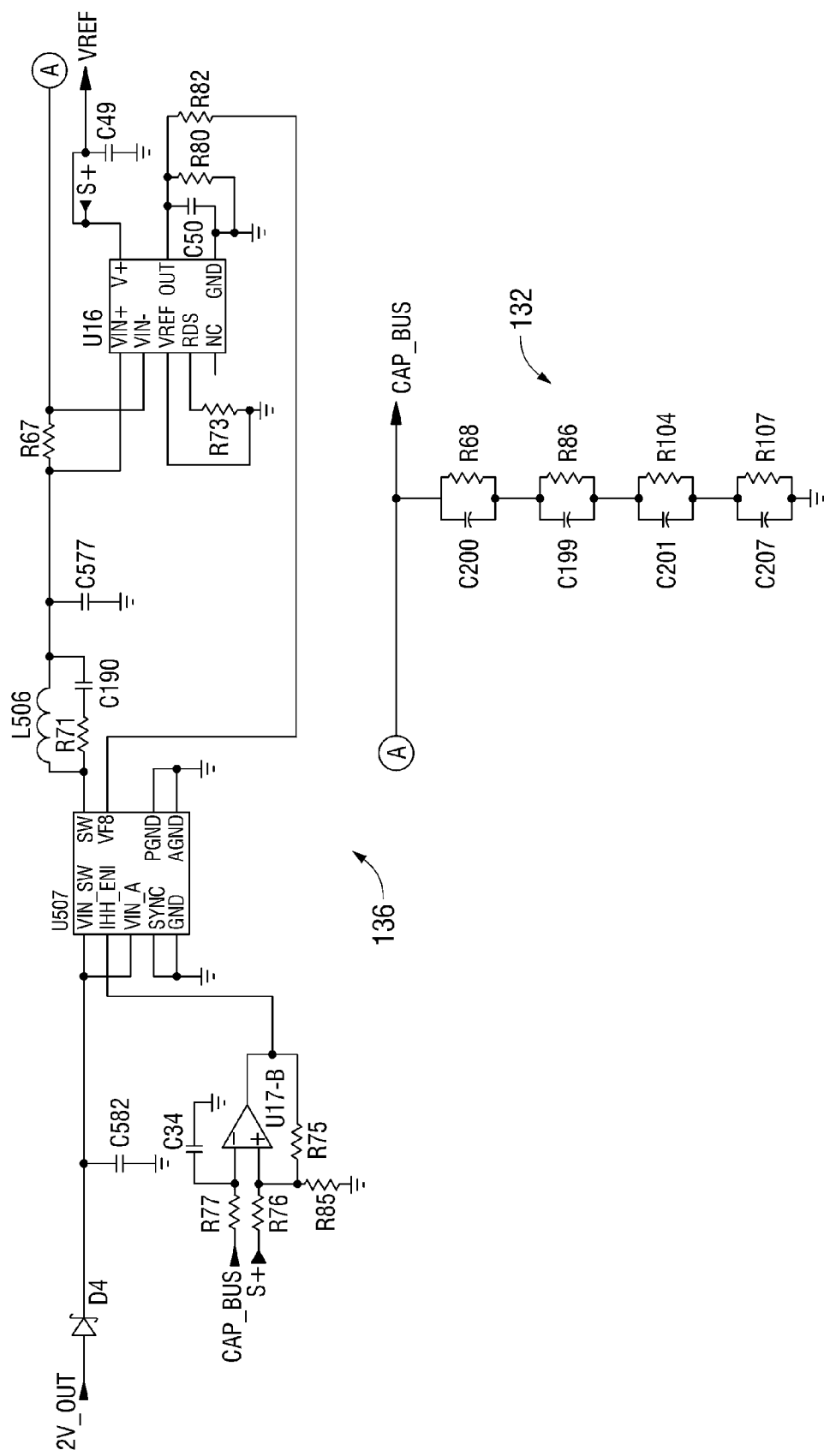
FIG. 7 illustrates a circuit diagram of an exemplary auxiliary power source and an initial charger for the auxiliary power source that may be used for the active low-pass current filter according to the disclosed embodiments.

Turning now to FIG. 7, an exemplary implementation of the capacitor bank 132 and initial charger circuit 136 is shown. As can be seen, the capacitor bank 132 in this embodiment is implemented via a first parallel network composed of capacitor C200 and resistor R68; a second parallel network composed of capacitor C199 and resistor R86; a third parallel network composed of capacitor C201 and resistor R104; and a fourth parallel network composed of capacitor C207 and resistor R107. These four parallel networks are then connected in series to create the capacitor bank 132. Other implementations of the capacitor bank 132 may also be devised by those having ordinary skill in the art without departing from the disclosed embodiments.

As for the initial charger circuit 136, this circuit may be implemented using a monolithic synchronous step-down regulator, labeled here as U507, a current sense amplifier U16, and an operational amplifier U17-B. In the implementation shown here, the step-down regulator is part number ST1S10 from STMicroelectronics. The power input supply voltage (VIN_SW) and the analog input supply voltage (VIN_A) pins of the step-down regulator U507 are connected to a 12 V power supply through a diode D4. A capacitor C582 (or optionally an appropriate network of such capacitors) couple VIN_SW and VIN_A to ground. The inhibit (INH (EN)) pin of the step-down regulator U507, meanwhile, is connected to the output of an operational amplifier, U17B, discussed further below. The synchronization and frequency select (SYNC), power ground (PGND), analog ground (AGND), and ground (GND) pins are all tied to ground. A network composed of inductor L506, resistor R71 and capacitor C190, and capacitor C577 connect the switching node (SW) pin of the step-down regulator U507 to the current sense amplifier U16.

The current sense amplifier U16, which may be high-side bidirectional current shunt monitor, part number INA170 from Texas Instruments, together with resistor R67 (or optionally an appropriate network of such resistors) allow the step-down regulator U507 to function as a constant current source. As can be seen, resistor R67 is connected between the inverting (VIN+) and non-inverting (VIN−) input pins of the current sense amplifier U16. The reference voltage input (VREF) and the ground (GND) pin are tied to ground, as is the offset resistor (ROS) pin through resistor R73. The output (OUT) pin of the current sense amplifier U16, meanwhile, is connected to the feedback voltage (VFB) pin of the step-down regulator U507. Power to the current sense amplifier U16 is provided through the supply voltage (V+) pin by the power rail S+.

As for the operational amplifier U17-B, this component together with resistors R75, R76 and R85 keep the step-down regulator U507 off unless the voltage on CAP_BUS falls below a predefined voltage level (e.g., 4 V). This circuit arrangement also operates to enable the charger circuit 136 until it reaches another, higher predefined voltage level, giving the charger 136 some hysteresis. The negative and positive inputs of the operational amplifier U17-B are connected to CAP_BUS and the power supply voltage S+, respectively, via resistors R77 and R76, respectively.

Figure 8:
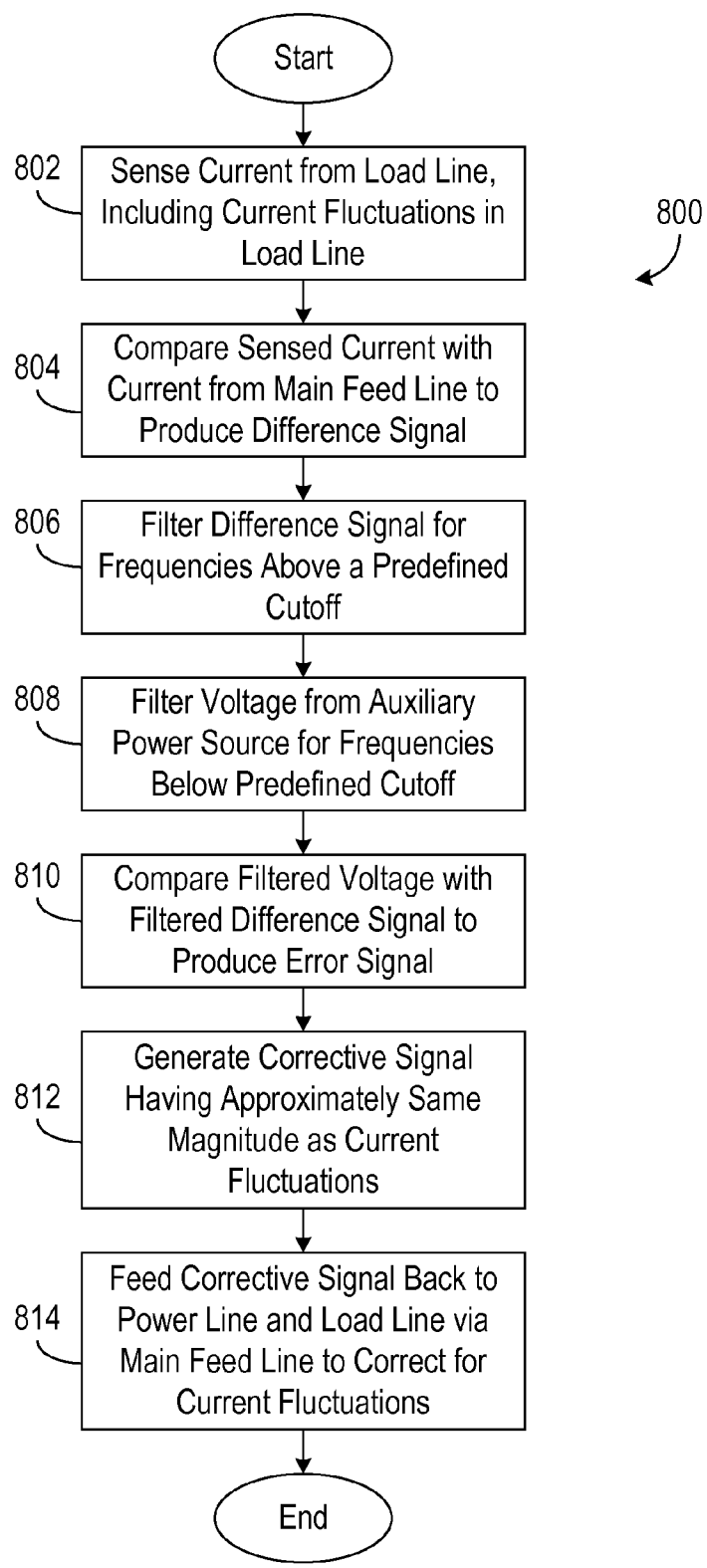
FIG. 8 illustrates a flow chart of an exemplary method that may be used for the active low-pass current filter according to the disclosed embodiments.

Implementation of the disclosed embodiments has been discussed thus far in terms of several specific circuits for suppressing conducted emissions. Following now in FIG. 8 are general guidelines in the form of a flow chart 800 that may be used to implement a method of suppressing conducted emissions according to the disclosed embodiments. Note that although the flowchart 800 contains a number of discrete functional blocks, one or more of these blocks may be removed from the flowchart 800, and/or one or more other blocks may be added to the flowchart 800, without departing from the scope of the disclosed embodiments. In addition, one or more of the blocks may be combined with one or more other blocks, or divided into multiple smaller blocks, as needed without departing from the disclosed embodiments. Furthermore, although the blocks are displayed in a particular order, those having ordinary skill in the art will recognize that one or more blocks may be taken out of sequence and/or simultaneously with one or more other blocks as needed.

The flowchart 800 begins generally at block 802, where current from the load line (e.g., 12 VDC, 25 ADC) is monitored and sensed for any current fluctuations therein. At block 804, the sensed current from the load line is compared with sensed current from the main feed line to produce a differential signal. The differential signal is then high-pass (or bandpass) filtered for frequencies above a predefined cutoff frequency (e.g., 30 Hz) at block 806. Next, at block 808, variations in the voltage of the auxiliary power source supplying power to the bidirectional DC-DC converter are low-pass filtered for frequencies below the predefined cutoff frequency via the auxiliary feed line. The high-pass filtered differential signal and low-pass filtered auxiliary feed signal are then compared at block 810 to produce an error signal. The error signal is then provided to the bidirectional DC-DC converter at block 812 in order to generate a corrective signal.

In accordance with the disclosed embodiments, the bidirectional DC-DC converter is configured to generate the corrective signal in a manner such that the corrective signal is approximately equal in magnitude to the current fluctuations on the load line. This corrective signal is then provided at block 814 to the power line and the load line via the main feed line to compensate for the fluctuations on the load line that have frequencies above the predefined cutoff frequency, thereby suppressing the specified emissions on the power line. In particular, the corrective signal causes current to be sourced to the load line or sunk from the power line, through the bidirectional DC-DC converter, eliminating such fluctuations in the power line. The corrective signal also causes current to be sourced to the load line or sunk from the power line, through the bidirectional DC-DC converter, to correct for variations in the voltage of the auxiliary power source that are below the predefined cutoff frequency.

Figure 9:
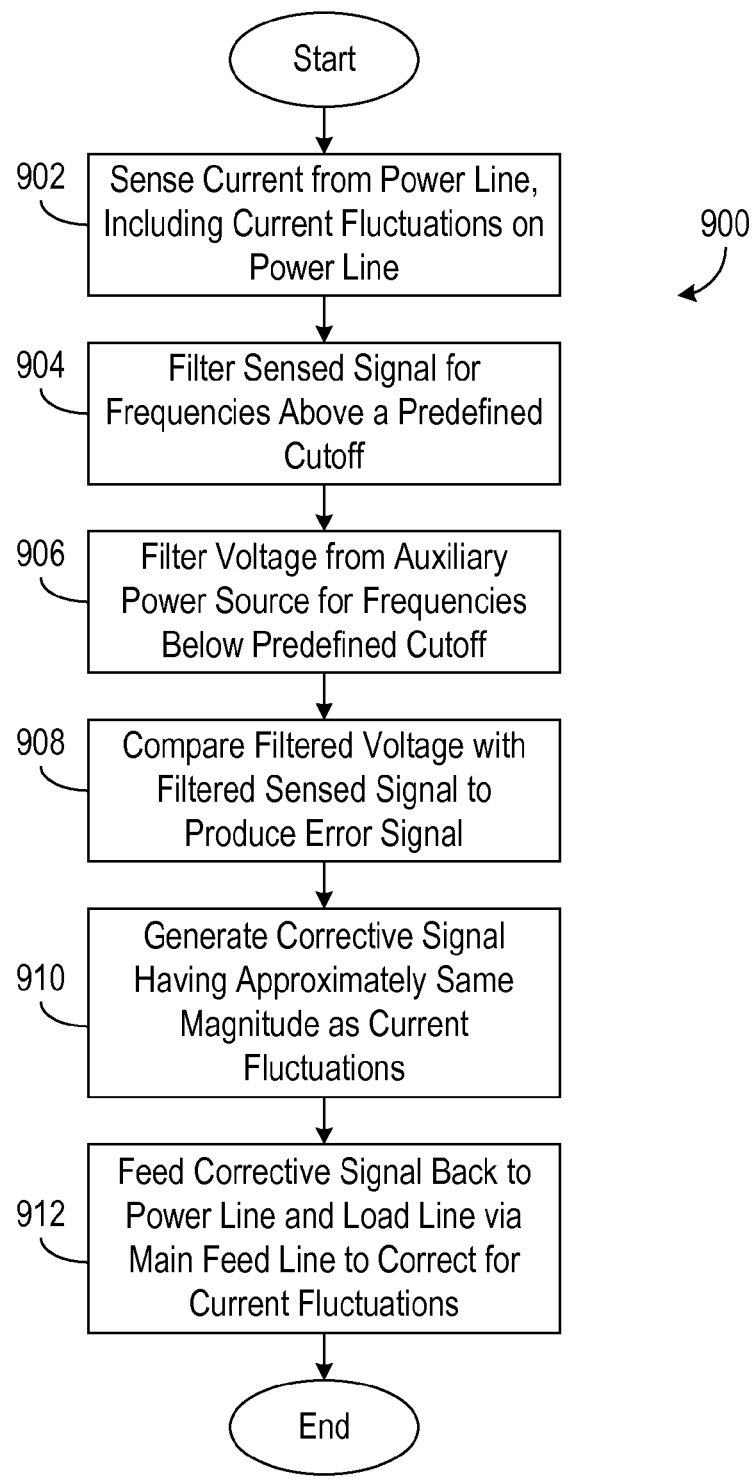
FIG. 9 illustrates a flow chart of another exemplary method that may be used for the active low-pass current filter according to the disclosed embodiments.

FIG. 9 illustrates general guidelines in the form of another flow chart 900 that may be used to implement a method of suppressing conducted emissions according to the disclosed embodiments. The flowchart 900 begins generally at block 902, where current from the power line (e.g., 12 VDC, 25 ADC) is monitored and sensed for any current fluctuations therein. At block 904, the sensed signal from the power line is high-pass (or bandpass) filtered for frequencies above a predefined cutoff frequency (e.g., 30 Hz). Next, at block 906, variations in the voltage of the auxiliary power source supplying power to the bidirectional DC-DC converter are low-pass filtered for frequencies below the predefined cutoff frequency via the auxiliary feed line. The high-pass filtered sensed signal and low-pass filtered auxiliary feed signal are then compared at block 908 to produce an error signal. The error signal is then provided to the bidirectional DC-DC converter at block 910 in order to generate a corrective signal.

As before, the bidirectional DC-DC converter is configured to generate the corrective signal in a manner such that the corrective signal is approximately equal in magnitude to the current fluctuations on the load line. This corrective signal is then provided at block 912 to the power line and the load line via the main feed line to compensate for the fluctuations on the power line that have frequencies above the predefined cutoff frequency, thereby suppressing the specified emissions on the power line. Specifically, the corrective signal causes current to be sourced to the load line or sunk from the power line, through the bidirectional DC-DC converter, eliminating such fluctuations in the power line. The corrective signal also causes current to be sourced to the load line or sunk from the power line, through the bidirectional DC-DC converter, to correct for variations in the voltage of the auxiliary power source that are below the predefined cutoff frequency.

While the disclosed aspects of the invention have been described with reference to one or more specific implementations, those skilled in the art will recognize that many changes may be made. Accordingly, each of the foregoing embodiments and obvious variations thereof is contemplated as falling within the spirit and scope of the different aspects of the invention, which are set forth in the following claims.

What is claimed is:

1. An apparatus for reducing conducted emissions on a power line, the power line providing power to load on a load line, comprising:
an active current filter connected to the power line and configured to monitor current in the power line or the load line to sense current fluctuations on the power line or the load line, the active current filter generating a corrective signal in response to the sensed current fluctuations and providing the corrective signal to the power line and the load line, the corrective signal causing current to be absorbed from the power line or fed to the load line as needed to reduce current fluctuations in the power line having frequencies above a predefined cutoff frequency; and
an auxiliary power source within the active current filter, the auxiliary power source providing a predefined DC voltage to the active current filter and configured to operate as a current reservoir for the active current filter to source current to the load line and sink current from the power line;
wherein the active current filter is further configured to monitor the predefined DC voltage of the auxiliary power source and to source current to the load line or sink current from the power line as needed to maintain the predefined DC voltage within a predefined voltage range without affecting the reduction of the current fluctuations.

2. The apparatus of claim 1, wherein the active current filter includes at least one of: a first current sensor, and a second current sensor.

3. The apparatus of claim 1, wherein the active current filter includes at least one of: a first high-pass filter, and a second high-pass filter.

4. The apparatus of claim 1, wherein the active current filter includes at least one of: a first differential amplifier, and a second differential amplifier.

5. The apparatus of claim 1, wherein the reduction of the current fluctuations reduces the conducted emissions from the power lead to less than 100 decibels micro-amps at frequencies above the predetermined cutoff frequency.

6. The apparatus of claim 1, further comprising an initial charger circuit configured to provide an initial charge for the auxiliary power source.

7. An apparatus for actively controlling emissions on a power line providing power to a load, comprising:
a main feed line coupled to the power line and a load line, and adapted to source current to the load line or sink current from the power line such that the current on the main feed line varies in response to the current sourced by the power line and sunk by the load line;
a first sensor adapted to sense the current provided by the power line to the load, including any high-frequency ripples appearing on the power line;
a second sensor adapted to sense current sourced to or sunk from the power line through the main feed line;
a first differential amplifier coupled to the first and second sensors and adapted to provide a first differential signal representative of a difference between the currents sensed by the first and second sensors;
a high-pass filter coupled to receive the first differential signal from the first differential amplifier, the high-pass filter adapted to provide a high-pass signal representative of components of the first differential signal having frequencies above a predefined main cutoff frequency;
a second differential amplifier coupled to receive the high-pass signal from the high-pass filter, the second differential amplifier adapted to provide a second differential signal representative of at least the high-pass signal;
a bidirectional DC-DC converter coupled to receive the second differential signal from the second differential amplifier, the bidirectional DC-DC converter being operable in a first mode to source current to the load line and a second mode to sink current from the power line, the bidirectional DC-DC converter being responsive to the second differential signal to source current to the load line or sink current from the power line to reduce high-frequency current ripples appearing on the power line;
a power reservoir coupled to the bidirectional DC-DC converter and adapted to provide power for the bidirectional DC-DC converter to source current to the load line when the bidirectional DC-DC converter is operated in the first mode and to sink current from the power line when the bidirectional DC-DC converter is operated in the second mode;
a comparator coupled to receive a voltage level from the power reservoir and configured to provide a comparator signal representative of a difference between the voltage level of the power reservoir and a reference voltage level; and
a low-pass filter coupled to receive the comparator signal from the comparator, the low-pass filter adapted to provide a low-pass signal representative of components of the comparator signal having frequencies below a predefined auxiliary cutoff frequency;
wherein the second differential amplifier is additionally coupled to receive the low-pass signal from the low-pass filter, and the second differential signal provided by the second differential amplifier is additionally representative of the low-pass signal; and wherein the bidirectional DC-DC converter is further responsive to the second differential signal to: (i) sink current from the power line to increase the voltage level of the power reservoir when the voltage level of the power reservoir falls below the reference voltage level, and (ii) source current to the load line to decrease the voltage level of the power reservoir when the voltage level of the power reservoir rises above the reference voltage level.

8. The apparatus of claim 7, further comprising an initial charger circuit configured to provide an initial charge for the power reservoir to bring the voltage level of the power reservoir up to the reference voltage level.

9. The apparatus of claim 7, wherein the comparator includes an operational amplifier configured as an inverting operational amplifier.

10. The apparatus of claim 7, wherein the predefined main cutoff frequency and the predefined auxiliary cutoff frequency are one of: the same frequency, and different frequencies.

11. The apparatus of claim 7, wherein the first and second current sensors are shunting type current sensors.

12. The apparatus of claim 7, wherein the differential amplifier is an operational amplifier.

13. The apparatus of claim 7, wherein the bidirectional DC-DC converter is one of the following: a combination buck-boost converter, and individual buck and boost converters.

14. The apparatus of claim 7, wherein the power reservoir is an intermediate storage element, including one or more of: a bulk capacitor and a bank of capacitors.

15. A method of reducing conducted emissions on a power lead using a bidirectional DC-DC converter, comprising:
receiving a differential signal representing a difference between a load current in a load lead and a feedback current in a main feed line connected to the power lead and the load lead, the differential signal containing substantially only frequencies above a predefined cutoff frequency;
receiving an auxiliary feed signal representing an auxiliary voltage signal from an auxiliary power source, the auxiliary feed signal containing substantially only frequencies below the predefined cutoff frequency; and
generating a corrective signal based on the differential signal and the auxiliary feed signal, the corrective signal causing the bidirectional DC-DC converter to:
(i) source current to the load lead or sink current from the power lead as needed to reduce conducted emissions having frequencies above the predefined cutoff frequency; and
(ii) source current to load lead or sink current from the power lead as needed to maintain a voltage level of the auxiliary power source within a predefined voltage range.

16. The method of claim 15, further comprising providing an initial charge to the auxiliary power source to bring the voltage level of the auxiliary power source up to a predefined reference level.

17. The method of claim 15, wherein the conducted emissions are reduced to less than 100 decibels micro-amps for conducted emissions having frequencies above the predefined cutoff frequency.

18. The method of claim 15, wherein the predefined cutoff frequency is a frequency that results in a 20-30 dB of gain for the differential signal at 30 Hertz.

19. The method of claim 15, wherein the load current is about 25 amps DC.

20. The method of claim 15, wherein the power lead carries one of the following voltages: 12 volts DC, and 28 volts DC.

* * * * *

UNITED STATES PATENT AND TRADEMARK OFFICE
CERTIFICATE OF CORRECTION

| | | |
|---|---|---|
| PATENT NO. | : 8,368,248 B2 | Page 1 of 1 |
| APPLICATION NO. | : 12/614908 | |
| DATED | : February 5, 2013 | |
| INVENTOR(S) | : Don D. Davis et al. | |

It is certified that error appears in the above-identified patent and that said Letters Patent is hereby corrected as shown below:

On the title page item (76) should read (75)

On the title page insert item

--(73) TEXAS MEMORY SYSTEMS, INC., Houston, TX (US)--

Signed and Sealed this
Nineteenth Day of May, 2015

Michelle K. Lee
*Director of the United States Patent and Trademark Office*